(12) United States Patent
Sénès et al.

(10) Patent No.: US 9,029,830 B2
(45) Date of Patent: May 12, 2015

(54) MULTI-QUANTUM WELL LED STRUCTURE WITH VARIED BARRIER LAYER COMPOSITION

(75) Inventors: Mathieu Xavier Sénès, Oxford (GB); Valerie Berryman-Bousquet, Chipping Norton (GB)

(73) Assignee: Sharp Kabushiki Kaisha, Osaka (JP)

( * ) Notice: Subject to any disclaimer, the term of this patent is extended or adjusted under 35 U.S.C. 154(b) by 185 days.

(21) Appl. No.: 13/465,545

(22) Filed: May 7, 2012

(65) Prior Publication Data

US 2013/0292637 A1   Nov. 7, 2013

(51) Int. Cl.
| | |
|---|---|
| *H01L 33/06* | (2010.01) |
| *H01L 33/32* | (2010.01) |
| *H01L 33/18* | (2010.01) |

(52) U.S. Cl.
CPC .............. *H01L 33/325* (2013.01); *H01L 33/06* (2013.01); *H01L 33/18* (2013.01)

(58) Field of Classification Search
CPC ...................................................... H01L 33/06
USPC ................................ 257/13, E33.008, 79–103
See application file for complete search history.

(56) References Cited

U.S. PATENT DOCUMENTS

| | | | |
|---|---|---|---|
| 6,515,313 B1 | 2/2003 | Ibbetson et al. | |
| 7,122,839 B2 | 10/2006 | Shen et al. | |
| 7,649,195 B2 | 1/2010 | Lee et al. | |
| 7,902,544 B2 | 3/2011 | Kim et al. | |
| 2003/0020085 A1* | 1/2003 | Bour et al. | 257/101 |
| 2009/0224226 A1* | 9/2009 | Huang et al. | 257/13 |
| 2010/0327278 A1* | 12/2010 | Ahn | 257/43 |

OTHER PUBLICATIONS

J. Piprek; "Efficiency droop in nitride-based light-emitting diodes"; Phys. Status Solidi A; 2010; pp. 1-9.
C. S. Xia et al.; "Droop improvement in blue InGaN/GaN multiple quantum well light-emitting diodes with indium graded last barrier";Appl. Phys. Lett. 99, 233501; 2011.
Y. K. Kuo et al.; "Advantages of blue InGaN multiple-quantum well light-emitting diodes with InGaN barriers"; Appl. Phys. Lett. 95, 011116; 2009.

* cited by examiner

*Primary Examiner* — Asok K Sarkar
*Assistant Examiner* — Dmitriy Yemelyanov
(74) *Attorney, Agent, or Firm* — Renner, Otto, Boisselle & Sklar, LLP

(57) ABSTRACT

A group III nitride-based light emitting device includes an n-type group III nitride-based semiconductor layer, a p-type group III nitride-based semiconductor layer, and a group III nitride-based active region between the p-type semiconductor layer and the n-type semiconductor layer. The active region includes a plurality of sequentially stacked group III nitride-based quantum well layers interspersed with barrier layers. A plurality of the barrier layers have a variation in composition of a first element along a growth direction within a thickness of each of the plurality of barrier layers, and the variation in composition of the first element has at least one minimum and a position of the minimum varies in the plurality of barrier layers. The first element may be indium or aluminum, and the number of barrier layers including the composition variation may be at least three barrier layers. The composition variation may vary linearly or non-linearly.

20 Claims, 6 Drawing Sheets

MULTI-QUANTUM WELL LED STRUCTURE WITH VARIED BARRIER LAYER COMPOSITION

TECHNICAL FIELD

The present invention relates to the field of light emitting devices, and more particularly a multi-quantum well LED structure with varied barrier layer composition having improved light output efficiency.

BACKGROUND OF THE INVENTION

Light emitting diodes (LEDs) are key components to a wide range of applications that include backlighting units for liquid crystal displays, headlamps for automobiles, or general lighting. For example, nitride semiconductor based blue and green emitting LEDs are widely used in these applications. However, such LEDs still suffer from degraded performance at high current injection caused by a phenomenon commonly referred to in the art as "efficiency droop".

It has been reported in the art that one possible cause of the efficiency droop may be due to the presence of an internal polarisation field in nitride LEDs. Indeed, the crystal layers in group III-nitride devices are often grown as strained wurtzite crystals on lattice-mismatched substrates such as sapphire. Such crystals exhibit two types of polarisations: spontaneous polarisation, which arises from the crystal symmetry, and piezoelectric polarisation, which arises from strain. The total polarisation is the sum of the spontaneous and piezoelectric polarisations.

Such internal polarisation field has potential detrimental effects on the internal quantum efficiency of nitride LEDs. For example, the polarisation field across an InGaN quantum wells active region leads to band bending, which makes it more likely that electrons jump across quantum wells and escape into p-type layers. This band bending may also limit the holes injection efficiency into the quantum wells by reducing the hole mobility at the interface of two group III-nitride layers of different composition. In addition, the internal polarisation field affects the radiative recombination efficiency by separating the electron and hole wave-functions. More details about the efficiency droop mechanism can be found in the following articles and in their references: J. Piprek, Phys. Status Solidi A, 1-9 (2010), C. S. Xia et al., Appl. Phys. Lett. 99, 233501 (2011); and Y. K. Kuo et al., Appl. Phys. Lett. 95, 011116 (2009).

Therefore, it is desirable to reduce the effect of the internal polarisation fields on the carrier diffusion and carrier recombination, so the light output power of group III-nitride LEDs is improved.

An approach for reducing or cancelling the effect of the internal polarisation field is to grade the composition of the quantum well layers to generate space charges and quasi-fields that oppose polarisation-induced charges. This approach is described in Ibbetson et al., U.S. Pat. No. 6,515,313, issued on Feb. 4, 2003. Ibbetson discloses that a continuous or discrete grading of the indium concentration in the active region creates a quasi-field opposite to the internal polarisation field, thus leading to a better spatial overlap of the carriers increasing emission efficiency.

A second approach, described in Shen et al., U.S. Pat. No. 7,122,839, issued on Oct. 17, 2006, includes grading the composition of either the quantum wells or the barriers, such that the change in the composition is at least 0.2% per angstrom.

A third approach, described in Kim et al., U.S. Pat. No. 7,902,544, issued on Mar. 8, 2011, includes using quantum barrier layers featuring a band-gap modulated multilayer structure, instead of grading the composition like in the previous two patents. The multilayer structure includes at least two types of layers with different band gaps, the two types of layers stacked repeatedly. The consequence of using such a structure is a stronger current spreading effect.

However, none of the patents referenced above describe how to control the composition profile in each of the barrier layers in the case of an LED active region that has more than two quantum wells.

Another approach, described in Lee et al., U.S. Pat. No. 7,649,195, issued on Jan. 19, 2010, includes at least one middle barrier layer having a band gap relatively wider than the other barrier layers in the active region of a multiple quantum well LED structure. Accordingly, positions at which electrons and holes are combined in the multiple quantum well structure to emit light can be controlled, and luminous efficiency can be enhanced. However, this structure does not reduce the internal polarisation filed effect, and the carriers are still affected by this field.

SUMMARY OF THE INVENTION

To overcome the above deficiencies of conventional LED structures, there is a need in the art to provide an improved and enhanced LED structure with high efficiency in which the effect of the internal polarisation field is reduced and the carrier recombination rate and the carrier mobility are increased.

The present invention improves and enhances the internal efficiency of a semiconductor LED, with layers grown along a polar direction, by improving the carrier distribution among the quantum well layers of the light emitting region.

Exemplary embodiments of the present invention include a light emitting diode that has a multiple quantum well layer structure, wherein the composition profile of at least three barrier layers possesses at least one minimum, and the position of this minimum varies among the said barrier layers.

According to one embodiment of the invention, the light emitting diode is fabricated in the (Al,In,Ga)N material system.

According to another embodiment of the invention, the barrier layers may be, for example, $In_xGa_{1-x}N$, $Al_xGa_{1-x}N$ or $In_xAl_yGa_{1-x-y}N$.

An aspect of the invention, therefore, is a group III nitride-based light emitting device that includes an n-type group III nitride-based semiconductor layer, a p-type group III nitride-based semiconductor layer, and a group III nitride-based active region between the p-type semiconductor layer and the n-type semiconductor layer. The active region includes a plurality of sequentially stacked group III nitride-based quantum well layers interspersed with barrier layers. A plurality of the barrier layers have a variation in composition of a first element along a growth direction within a thickness of each of the plurality of barrier layers, and the variation in composition of the first element has at least one minimum and a position of the minimum varies across a thickness direction in the plurality of barrier layers.

In an exemplary embodiment of the nitride-based light emitting device, the barrier layers are AlInGaN layers.

In an exemplary embodiment of the nitride-based light emitting device, the first element is indium.

In an exemplary embodiment of the nitride-based light emitting device, the first element is aluminium.

In an exemplary embodiment of the nitride-based light emitting device, the barrier layers are InGaN layers and the first element is indium.

In an exemplary embodiment of the nitride-based light emitting device, the position of the minimum varies linearly in the plurality of barrier layers, starting closer to a bottom of a barrier layer which is closer to the n-type semiconductor layer.

In an exemplary embodiment of the nitride-based light emitting device, the position of the minimum varies linearly in the plurality of barrier layers, starting closer to a top of a barrier layer which is closer to the n-type semiconductor layer.

In an exemplary embodiment of the nitride-based light emitting device, the position of the minimum varies in a non-linear manner in the plurality of barrier layers.

In an exemplary embodiment of the nitride-based light emitting device, the position of the minimum varies in an exponential manner in the plurality of barrier layers.

In an exemplary embodiment of the nitride-based light emitting device, the position of the minimum varies in a logarithmic manner in the plurality of barrier layers.

In an exemplary embodiment of the nitride-based light emitting device, the position of the minimum varies in a polynomial manner in the plurality of barrier layers.

In an exemplary embodiment of the nitride-based light emitting device, the position of the minimum varies in a monotonous manner in the plurality of barrier layers.

In an exemplary embodiment of the nitride-based light emitting device, the position of the minimum varies in a non-monotonous manner in the plurality of barrier layers.

In an exemplary embodiment of the nitride-based light emitting device, the position of the minimum varies in all the barrier layers of the active region.

In an exemplary embodiment of the nitride-based light emitting device, the plurality of barrier layers have a variation in composition of the first element within the thickness of the plurality of barrier layers, and the variation in composition of the first element has at least two minimums and positions of the two minimums vary in the plurality of barrier layers.

In an exemplary embodiment of the nitride-based light emitting device, the indium composition in the plurality of barrier layers is graded.

In an exemplary embodiment of the nitride-based light emitting device, the aluminium composition in the plurality of barrier layers is graded.

In an exemplary embodiment of the nitride-based light emitting device, the composition of the first element in the plurality of barrier layers varies in a portion of the barrier layers, and does not vary in another portion of the barrier layers.

In an exemplary embodiment of the nitride-based light emitting device, the composition of the first element in the plurality of barrier layers varies in at least three of the barrier layers.

Another aspect of the invention is another group III nitride-based LED, that includes an n-type group III nitride-based semiconductor layer, a p-type group III nitride-based semiconductor layer, and a group III nitride-based active region between the p-type semiconductor layer and the n-type semiconductor layer. The active region includes at least six sequentially stacked group III nitride-based quantum well layers and at least seven barrier layers. At least three of the barrier layers have a variation in composition of a first element along a growth direction within their thickness, and the variation in composition of the first element has at least one minimum and a position of the minimum varies across a thickness direction in the at least three barrier layers.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DESCRIPTION OF REFERENCE NUMERALS

Figure 3A:
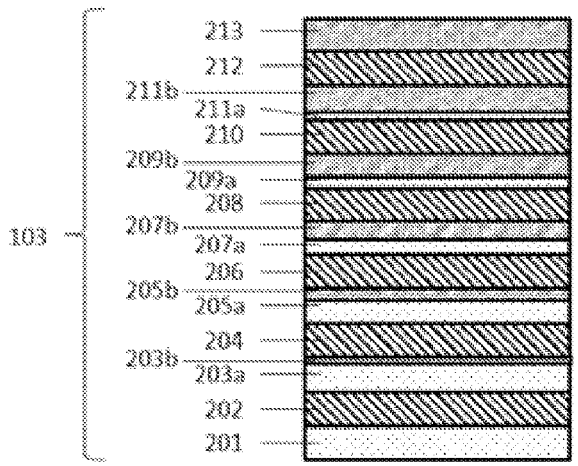
FIG. 3A is a cross sectional view of a light emitting region of the light emitting device of FIG. 1.
Figure 3B:
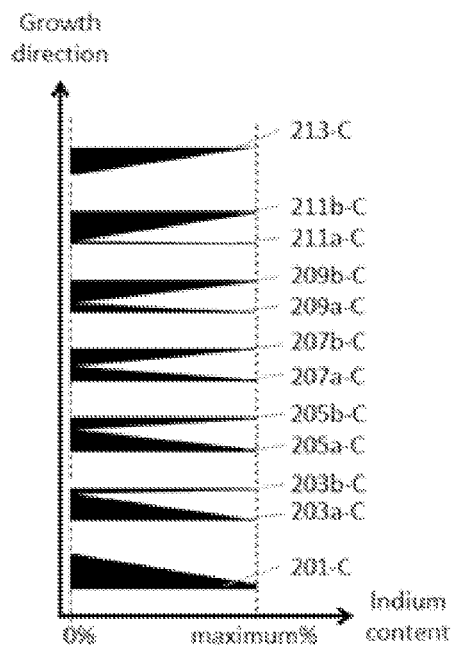
FIG. 3B is the corresponding indium composition profile of the barrier layers, according to exemplary embodiments of the current invention.

10 Light emitting diode
101 Sapphire substrate 102 n-type (Al,In,Ga)N layer
103 Light emitting region (active region)
104 (Al,In,Ga)N electron blocking layer
105 p-type (Al,In,Ga)N layer
201 First barrier layer
201-C Indium composition of first barrier layer
202 First quantum well layer
203 Second barrier layer
203a First portion of the second barrier layer
203b Second portion of the second barrier layer
203a-C Indium composition of the first portion of the second barrier layer
203b-C Indium composition of the second portion of the second barrier layer
204 Second quantum well layer
205 Third barrier layer
205a First portion of the third barrier layer
205b Second portion of the third barrier layer
205a-C Indium composition of the first portion of the third barrier layer
205b-C Indium composition of the second portion of the third barrier layer
206 Third quantum well layer
207 Fourth barrier layer
207a First portion of the fourth barrier layer
207b Second portion of the fourth barrier layer
207a-C Indium composition of the first portion of the fourth barrier layer
207b-C Indium composition of the second portion of the fourth barrier layer
208 Fourth quantum well layer
209 Fifth barrier layer
209a First portion of the fifth barrier layer
209b Second portion of the fifth barrier layer
209a-C Indium composition of the first portion of the fifth barrier layer
209b-C Indium composition of the second portion of the fifth barrier layer
210 Fifth quantum well layer
211 Sixth barrier layer
211a First portion of the sixth barrier layer
211b Second portion of the sixth barrier layer
211a-C Indium composition of the first portion of the sixth barrier layer
211b-C Indium composition of the second portion of the sixth barrier layer
212 Sixth quantum well layer
213 Seventh barrier layer
213-C Indium composition of the seventh barrier layer
501 Computed energy profile of the conduction band of a conventional LED device.
502 Computed energy profile of the conduction band Fermi level of a conventional LED device
503 Computed energy profile of the valence band Fermi level of a conventional LED device
504 Computed energy profile of the valence band of a conventional LED device.
505 Computed energy profile of the conduction band of the LED structure of FIG. 3A and FIG. 3B.
506 Computed energy profile of the conduction band Fermi level of the LED structure of FIG. 3A and FIG. 3B.
507 Computed energy profile of the valence band Fermi level of the LED structure of FIG. 3A and FIG. 3B.
508 Computed energy profile of the valence band of the LED structure of FIG. 3A and FIG. 3B.

DETAILED DESCRIPTION OF THE INVENTION

The preferred embodiments of the invention will be described with reference to the drawings, in which like references numerals are utilized for like structures. It will be appreciated that the drawings are not necessarily to scale.

A device of the present invention may be grown by any suitable means and on any suitable substrate, which include but is not limited to: sapphire, Silicon, GaN or SiC. For example, suitable processes for growing the described structures may include any suitable molecular beam epitaxy (MBE) process, chemical vapour deposition process, or the like.

Figure 1:
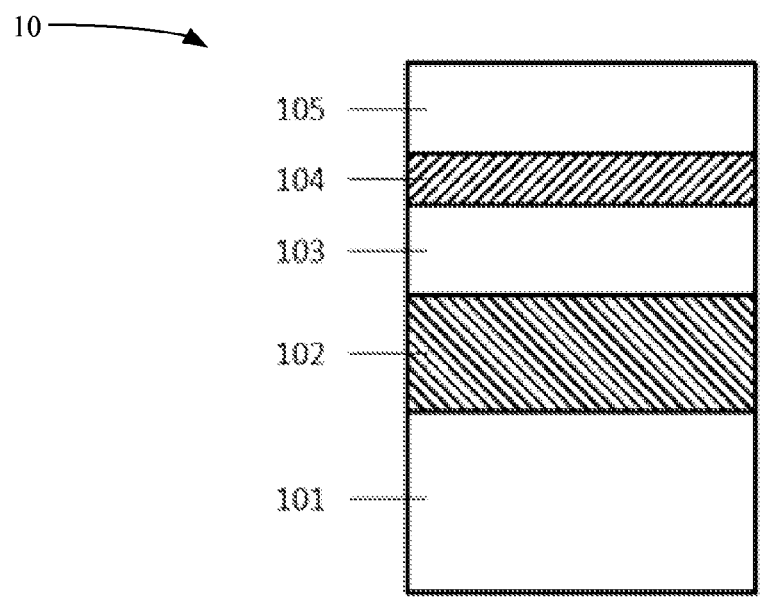
FIG. 1 is a cross sectional view of a light emitting device according to exemplary embodiments of the current invention.

Embodiments of the present invention will be described with reference to FIG. 1. FIG. 1 shows a schematic of a light emitting diode 10 fabricated in the (Al,In,Ga)N material system. The light emitting diode 10 may contain a sapphire substrate 101, an n-type (Al,In,Ga)N layer 102 disposed on top of the sapphire substrate 101, a light emitting region 103 disposed on top of the n-type buffer layer 102, an (Al,In,Ga)N electron blocking layer 104 disposed on top of the light emitting region 103, and a p-type (Al,In,Ga)N layer 105 disposed on top of the electron blocking layer 104.

As used herein, the light emitting region of a light emitting device refers to the region in which majority and minority electronic carriers (e.g., holes and electrons) recombine to produce light. In general, an active region according to embodiments of the current invention can include a quantum well structure, in which the total number of quantum wells is at least two, and more preferably greater than two, and preferably six or more, and the quantum well layers are fabricated in the (Al,In,Ga)N material system.

Figure 2:
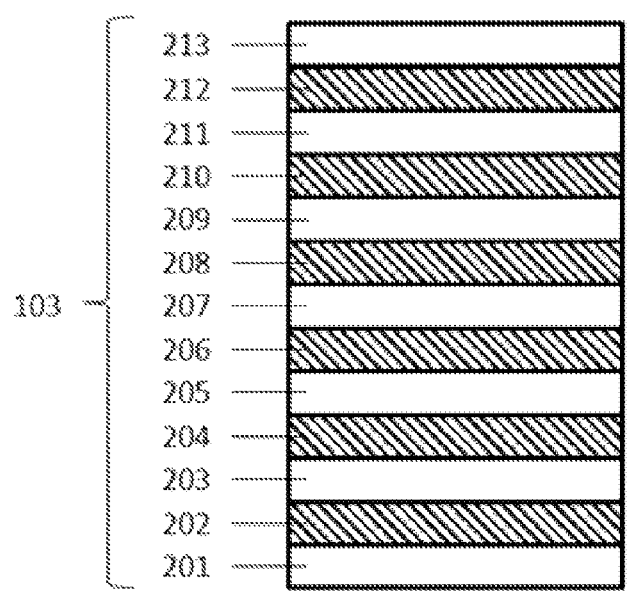
FIG. 2 is a cross sectional view of a light emitting region of the light emitting device of FIG. 1, according to exemplary embodiments of the current invention.

An example of a light emitting region 103 with six quantum well layers and seven barrier layers according to an exemplary embodiment of the current invention is depicted in FIG. 2. As shown in FIG. 2, the light emitting region 103 may contain: a first barrier layer 201, a first quantum well layer 202 disposed on the barrier layer 201 and having a band gap energy relatively smaller than the barrier layer 201, a second barrier layer 203 disposed on top of the first quantum well layer 202, a second quantum well layer 204 disposed on top of the second barrier layer 203, a third barrier layer 205 disposed on top of the second quantum well layer 204, a third quantum well layer 206 disposed on top of the third barrier layer 205, a fourth barrier layer 207 disposed on top of the third quantum well layer 206, a fourth quantum well layer 208 disposed on top of the fourth barrier layer 207, a fifth barrier layer 209 disposed on top of the fourth quantum well layer 208, a fifth quantum well layer 210 disposed on top of the fifth barrier layer 209, a sixth barrier layer 211 disposed on top of the fifth quantum well layer 210, a sixth quantum well layer 212 disposed on top of the sixth barrier layer 211 and a seventh barrier layer 213 disposed on top of the sixth quantum well layer 212. In this example, the quantum well layers 202, 204, 206, 208, 210 and 212 may be made of, but are not limited to, $In_xGa_{1-x}N$ in which $0<x\leq1$. The barrier layers 201, 203, 205, 207, 209, 211 and 213 may be made of, but are not limited to, $In_yGa_{1-y}N$, in which $0\leq y<1$ and $y<x$. Encompassed by such structure, the barrier layers may be AlInGaN layers. Moreover, in this exemplary embodiment the barrier layers 201, 203, 205, 207, 209, 211 and 213 all have the same thickness.

Generally, embodiments of the current invention may be described as follows. A group III nitride-based light emitting device includes an n-type group III nitride-based semiconductor layer, a p-type group III nitride-based semiconductor layer, and a group III nitride-based active region between the p-type semiconductor layer and the n-type semiconductor layer. The active region includes a plurality of sequentially stacked group III nitride-based quantum well layers interspersed with barrier layers. A plurality of the barrier layers have a variation in composition of a first element along the growth direction within a thickness of each of the plurality of barrier layers, and the variation in composition of the first element has at least one minimum and a position of the minimum varies across the thickness direction in the plurality of barrier layers. The first element may be indium or aluminium, and the number of barrier layers including the composition variation may be at least three barrier layers. The composition variation may vary linearly or non-linearly.

FIG. 3A depicts the composition of each a plurality of barrier layers within the active region 103, and FIG. 3B depicts the related composition profile of a first element of such barrier layers. In this particular example, the first element is indium, and FIG. 3B depicts the composition profile of indium in each of the plurality of barrier layers. As referenced above, the first element may be, for example, aluminium. As depicted in FIGS. 3A and 3B, the first barrier layer 201 may be made of InGaN in which the indium composition 201-C of the barrier layer 201 is varied linearly along the growth direction from a maximum value at the interface between the buffer layer 102 and the barrier layer 201, to a value of about 0 at the interface between the barrier layer 201 and the first quantum well layer 202.

The second barrier layer 203 may include a first portion 203a and a second portion 203b, in which the first portion 203a has a thickness relatively smaller than the thickness of the barrier layer 201 and the second portion 203b has a thickness so the total thickness of the first portion 203a and the second portion 203b is equal to the thickness of the barrier layer 201. The first portion 203a of the barrier layer 203 may be made of InGaN, in which the indium composition 203a-C of the first portion 203a of the barrier layer 203 is varied linearly along the growth direction from a maximum value at the interface between the first quantum well layer 202 and the barrier layer 203 to a value of about 0 at the interface between the first portion 203a and the second portion 203b of the barrier layer 203. In this exemplary embodiment, the maximum value of the indium composition of the first portion 203a of the barrier layer 203 is the same as the maximum value of the indium composition of the barrier layer 201. The second portion 203b of the barrier layer 203 may be made of InGaN, in which the indium composition 203b-C of the second portion 203b of the barrier layer 203 is varied linearly along the growth direction from a value of about 0 at the interface between the first portion 203a and the second portion 203b of the barrier layer 203 to a maximum value at the interface between the second portion 203b of the barrier layer 203 and the second quantum well layer 204. In this exemplary embodiment, the maximum value of the indium composition of the second portion 203b of the barrier layer 203 is the same as the maximum value of the indium composition of the first portion 203a of the barrier layer 203.

The third barrier layer 205 may include a first portion 205a and a second portion 205b, in which the first portion 205a has a thickness relatively smaller than the thickness of the barrier layer 203 and the second portion 205b has a thickness so the total thickness of the first portion 205a and the second portion 205b is equal to the thickness of the barrier layer 203. The first portion 205a of the barrier layer 205 may be made of InGaN, in which the indium composition 205aC of the first portion 205a of the barrier layer 205 is varied linearly along the growth direction from a maximum value at the interface between the quantum well layer 204 and the barrier layer 205 to a value of about 0 at the interface between the first portion 205a and the second portion 205b of the barrier layer 205. In this exemplary embodiment, the maximum value of the indium composition of the first portion 205a of the barrier layer 205 is the same as the maximum value of the indium composition of the barrier layer 203. The second portion 205b of the barrier layer 205 may be made of InGaN, in which the indium composition 205b-C of the second portion 205b of the barrier layer 205 is varied linearly along the growth direction from a value of about 0 at the interface between the first portion 205a and the second portion 205b of the barrier layer 205 to a maximum value at the interface between the second portion 205b of the barrier layer 205 and the third quantum well layer 206. In this exemplary embodiment, the maximum value of the indium composition of the second portion 205b of the barrier layer 205 is the same as the maximum value of the indium composition of the first portion 205a of the barrier layer 205.

The fourth barrier layer 207 may include a first portion 207a and a second portion 207b, in which the first portion 207a has a thickness relatively smaller than the thickness of the first portion 205a of the barrier layer 205 and the second portion 207b has a thickness so the total thickness of the first portion 207a and the second portion 207b is equal to the thickness of the barrier layer 205. The first portion 207a of the barrier layer 207 may be of InGaN, such as the indium composition 207a-C of the first portion 207a of the barrier layer 207 is varied linearly along the growth direction from a maximum value at the interface between the quantum well layer 206 and the barrier layer 207 to a value of about 0 at the interface between the first portion 207a and the second portion 207b of the barrier layer 207. In this exemplary embodiment, the maximum value of the indium composition of the first portion 207a of the barrier layer 207 is the same as the maximum value of the indium composition of the barrier layer 203. The second portion 207b of the barrier layer 207 is made of InGaN, in which the indium composition 207b-C of the second portion 207b of the barrier layer 207 is varied linearly along the growth direction from a value of about 0 at the interface between the first portion 207a and the second portion 207b of the barrier layer 207 to a maximum value at the interface between the second portion 207b of the barrier layer 207 and the fourth quantum well layer 208. In this exemplary embodiment, the maximum value of the indium composition of the second portion 207b of the barrier layer 207 is the same as the maximum value of the indium composition of the first portion 207a of the barrier layer 207.

The fifth barrier layer 209 may include a first portion 209a and a second portion 209b, such as the first portion 209a has a thickness relatively smaller than the thickness of the first portion 207a of the barrier layer 207 and the second portion 209b has a thickness so the total thickness of the first portion 209a and the second portion 209b is equal to the thickness of the barrier layer 207. The first portion 209a of the barrier layer 209 may be made of InGaN, in which the indium composition 209a-C of the first portion 209a of the barrier layer 209 is varied linearly along the growth direction from a maximum value at the interface between the quantum well layer 208 and the barrier layer 209 to a value of about 0 at the interface between the first portion 209a and the second portion 209b of the barrier layer 209. In this exemplary embodiment, the maximum value of the indium composition of the first portion 209a of the barrier layer 209 is the same as the maximum value of the indium composition of the barrier layer 203. The second portion 209b of the barrier layer 209 is made of InGaN, in which the indium composition 209b-C of the second portion 209b of the barrier layer 209 is changed linearly along the growth direction from a value of about 0 at the interface between the first portion 209a and the second portion 209b of the barrier layer 209 to a maximum value at the interface between the second portion 209b of the barrier layer 209 and the fifth quantum well layer 210. In this exemplary embodiment, the maximum value of the indium composition of the second portion 209b of the barrier layer 209 is the same as the maximum value of the indium composition of the first portion 209a of the barrier layer 209.

The sixth barrier layer 211 may include a first portion 211a and a second portion 211b, in which the first portion 211a has a thickness relatively smaller than the thickness of the first portion 209a of the barrier layer 209 and the second portion 211b has a thickness so the total thickness of the first portion 211a and the second portion 211b is equal to the thickness of the barrier layer 209. The first portion 211a of the barrier layer 211 may be made of InGaN, in which the indium composition 211a-C of the first portion 211a of the barrier layer 211 is varied linearly along the growth direction from a maximum value at the interface between the quantum well layer 210 and the barrier layer 211 to a value of about 0 at the interface between the first portion 211a and the second portion 211b of the barrier layer 211. In this exemplary embodiment, the maximum value of the indium composition of the first portion 211a of the barrier layer 211 is the same as the maximum value of the indium composition of the barrier layer 203. The second portion 211b of the barrier layer 211 may be made of InGaN, in which the indium composition 211b-C of the second portion 211b of the barrier layer 211 is varied linearly along the growth direction from a value of about 0 at the interface between the first portion 211a and the second portion 211b of the barrier layer 211 to a maximum value at the interface between the second portion 211b of the barrier layer 211 and the sixth quantum well layer 212. In this exemplary embodiment, the maximum value of the indium composition of the second portion 211b of the barrier layer 211 is the same as the maximum value of the indium composition of the first portion 211a of the barrier layer 211. The seventh barrier layer 213 is made of InGaN in which the indium composition 213-C of the barrier layer 213 is varied linearly along the growth direction from a value of about 0 at the interface between the quantum well layer 212 and the barrier layer 213 to a maximum value at the interface between the barrier layer 213 and the electron blocking layer 104. In this exemplary embodiment, the maximum value of the indium composition of the barrier layer 213 is the same as the maximum value of the indium composition of the barrier layer 202.

Figure 4:
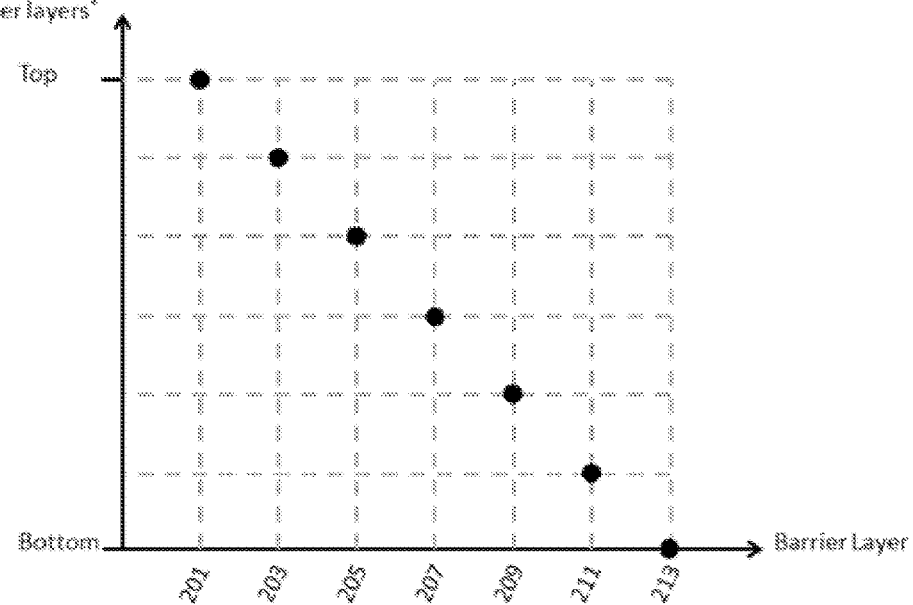
FIG. 4 is a graph that illustrates the position of the minimum of the indium composition within the thickness of the barrier layers of the light emitting region of FIG. 3, according to exemplary embodiments of the current invention.

The embodiment of FIGS. 3A and 3B, therefore, generally may be described as follows. A group III nitride-based LED includes an n-type group III nitride-based semiconductor layer, a p-type group III nitride-based semiconductor layer, and a group III nitride-based active region between the p-type semiconductor layer and the n-type semiconductor layer. The active region includes at least six sequentially stacked group III nitride-based quantum well layers and at least seven barrier layers. A plurality of the barrier layers (and preferably at least three of the barrier layers) have a variation in composition of a first element (e.g., indium) along the growth direction within their thickness, and the variation in composition of the first element has at least one minimum and a position of the minimum varies across the thickness direction in a plurality of (and preferably in at least three of) the barrier layers. Generally, based on the above description with respect to FIGS. 3A and 3B, the indium composition profile in each of the barrier layers 201, 203, 205, 207, 209, 211 and 213 possesses one minimum, and the position of this minimum within the thickness of each of the barrier layer changes linearly and proportionally across the barrier layers as depicted in FIG. 3B. FIG. 4 provides an illustration of the position variation of the indium composition minimum in each of the barrier layers.

In particular, FIG. 4 illustrates the position of the indium composition minimum across the thickness direction within the barrier layer thickness for each of the barrier layers. In the graph of FIG. 4, the bottom layer represents the side of the barrier layer which is closest to the n-type side of the LED. Similarly, the top of the barrier layer represents the side of the barrier layer which is closest to the p-type side of the LED. Such indium composition profile in each of the barrier layers of the active region 103 has an effect on the conduction band and valence band profile.

Figure 5A:
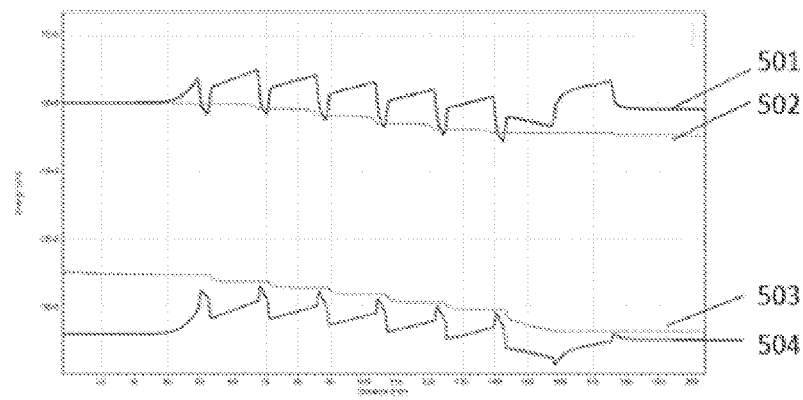
FIG. 5A is a graph that illustrates the band structure for a reference LED according to exemplary embodiments of the current invention.
Figure 5B:
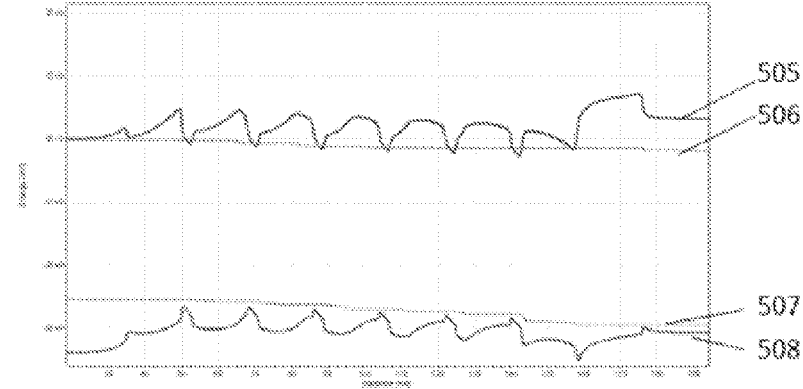
FIG. 5B is a graph that illustrates the band structure for the example of the light emitting region illustrated in FIG. 3.

FIG. 5A and FIG. 5B compare simulation results from a reference LED structure similar to FIG. 1 and FIG. 2 in which the barrier layers 201, 203, 205, 207, 209, 211 and 213 are made of GaN, to the LED structure of FIG. 3A and FIG. 3B in accordance with the embodiment of the present invention described above. In other words, FIG. 5A represents the conduction band and valence structure of a conventional LED device, and FIG. 5B represents the conduction band and valence structure of an LED device in accordance with embodiments of the current invention as described above. The simulation was performed using the simulator of light emitters based on nitride semiconductors. FIG. 5A represents the simulated energy profile of the valence band 504 and of the conduction band 501, as well as the respective energy profile of the valence band Fermi level 503 and of the conduction band Fermi level 502 for a conventional LED device. Similarly, FIG. 5B represents the simulated energy profile of the valence band 508 and of the conduction band 505, as well as the respective energy profile of the valence band Fermi level 507 and of the conduction band Fermi level 506 for an LED device in accordance with embodiments of the current invention above. At a similar current injection, the valence band profile 508 of the barrier layers of the LED structure of the embodiment of the current invention is significantly flatter than that of the conventional LED structure 504, which exhibits a 'saw-like' profile because of the internal polarisation field effect.

A consequence of the flat valence band profile of the current invention is an enhanced injection of the holes in the quantum well layers of the active region, thus leading to an increase of the internal quantum efficiency and a reduction of the efficiency droop. This can be observed in FIG. 5B where the valence band Fermi level 507 is closer to the energy minimums of the valence band 508 compared to the conventional LED in FIG. 5A. Another advantage of the present invention which can be observed in FIG. 5B is the larger energy separation between the conduction band Fermi level 506 and the maximum peak of the conduction band 505 corresponding to the electron blocking layer compared to the reference LED. This larger energy separation is a consequence of the reduced internal polarisation field in the active region of an LED device in accordance with embodiments of the current invention. The larger energy separation will reduce the electron overflow above the electron blocking layer, and will lead to a reduction of the efficiency droop effect.

Figure 6:
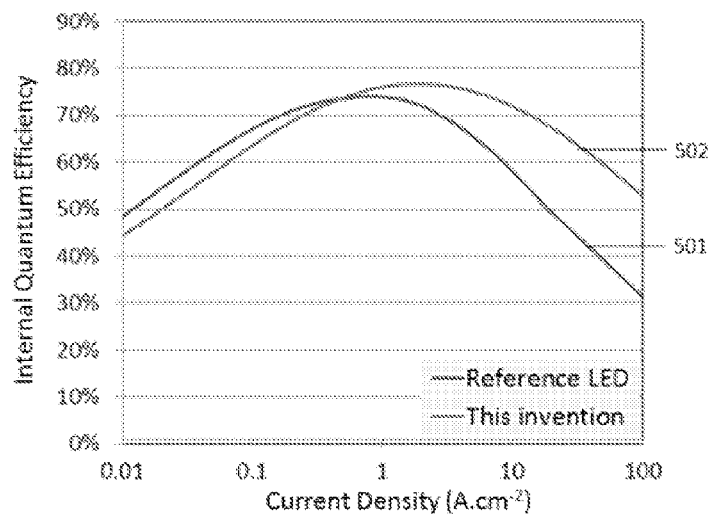
FIG. 6 is a graph that illustrates internal quantum efficiency of a reference light emitting device and of a light emitting device having a light emitting region as illustrated in FIG. 3, according to exemplary embodiments of the current invention.

FIG. 6 depicts the simulation results of the internal quantum efficiency as a function of the current injection for the reference LED structure and the LED structure described in the above embodiment of the present invention. The internal quantum efficiency of the LED structure described in the above embodiment of the present invention is higher than that of the standard LED structure for current densities larger than around $1 A \cdot cm^{-2}$, and the structure of the present invention also exhibits a lower efficiency droop.

Although the invention has been described with a particular structure in the embodiment shown in FIGS. 3A and 3B, it will be apparent to those skilled in the art that variations of this structure are possible without departing from the spirit or scope of the invention. For example, the minimum value of the indium composition in one or more barrier layers of the active region 103 of FIGS. 3A and 3B can be different from 0. Moreover, the minimum value of the indium composition of one or more barrier layers of the light emitting region 103 of FIGS. 3A and 3B can be different compared to the minimum value of the indium composition of the other barrier layers of the light emitting region 103. Similarly, the maximum value of the indium composition in one or more barrier layers can be different as compared to the maximum value of the indium composition of the other barrier layers of the light emitting region 103. Furthermore, within the same barrier layer, the two maximum values of the indium composition can be different from each other.

In the above embodiment as depicted in FIGS. 3A and 3B, all the barrier layers 201, 203, 205, 207, 209, 211 and 213 have the same thickness. However, one or more barrier layers of the light emitting region 103 can have a different thickness.

In the above embodiment of the present invention as depicted in FIGS. 3A and 3B, the indium composition in each barrier layer or portion of barrier layer (201, 203a, 203b, 205a, 205b, 207a, 207b, 209a, 209b, 211a, 211b, 213) is varied linearly. However, other non-linear functional forms for the indium composition profile may be used. For example, the indium composition may be varied in one or more of the barrier layers or portion of barrier layers in an exponential, parabolic or step-wise manner. The indium composition may also be graded, and if the first element is aluminium, the aluminium composition also may be graded. The indium (or aluminium) composition may also vary in a discrete way instead of in a continuous way like in the above embodiment.

Moreover, one or more barrier layers may have one or more sections within their thickness in which the indium composition is constant.

In addition, the maximum value y of the indium composition in the $In_yGa_{1-y}N$ barrier layers 201, 203, 205, 207, 209, 211 and 213 may be, but not limited to, $0<y\leq0.4$, and more preferably $0.01\leq y\leq0.1$.

The thickness of the barrier layers 201, 203, 205, 207, 209, 211 and 213 is preferably, but not limited to, between 0.5 nm and 50 nm, and more preferably between 1 nm and 20 nm.

FIGS. 7-12 are graphs that illustrate variations of the configuration of the indium minimum of the indium composition profile. As with respect to FIG. 4, in FIGS. 7-12 the bottom layer represents the side of the barrier layer which is closest to the n-type side of the LED. Similarly, the top of the barrier layer represents the side of the barrier layer which is closest to the p-type side of the LED.

Figure 7:
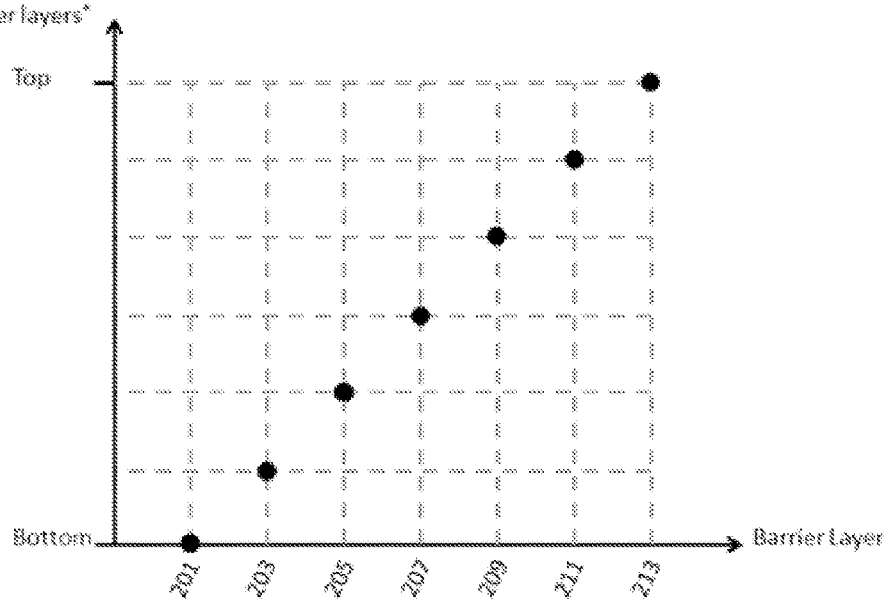
FIG. 7 is a graph that illustrates the position of the minimum of the indium composition within the thickness of the barrier layers of the light emitting region of FIG. 2, according to exemplary embodiments of the current invention.

In the exemplary embodiment of FIG. 7, the position of the indium minimum of the indium composition profile of the barrier layers varies linearly across the thickness of the barrier layers of the active region 103, and the indium minimum is sensibly closer to the bottom of the barrier layer in the barrier layer 201 next to the n-type semiconductor layer of the LED, and then moves linearly toward the top of the barrier layer across the active region to finally be sensibly closer to the top of the barrier layer in the barrier layer 213 next to the p-type semiconductor layer of the LED.

Figure 8:
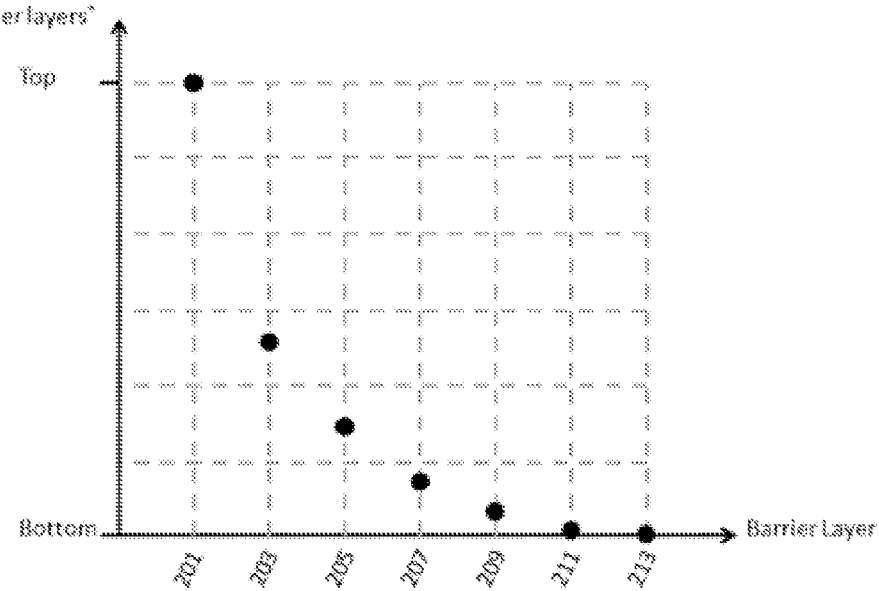
FIG. 8 is a graph that illustrates the position of the minimum of the indium composition within the thickness of the barrier layers of the light emitting region of FIG. 2, according to exemplary embodiments of the current invention.

In the exemplary embodiment depicted in FIG. 8, the indium composition profile in the barrier layers 201, 203, 205, 207, 209, 211 and 213, possesses one minimum, and the position of this minimum within the thickness of each of the barrier layers changes in a non-linear manner across the barrier layers. In the example depicted in FIG. 8, the position of the minimum changes in an exponential manner across the barrier layers. Other functional forms are possible, for example, including but not limited to: logarithmic, polynomial, and other non-linear variations. In above embodiments, the position of the minimum varies in a monotonous manner.

Figure 9:
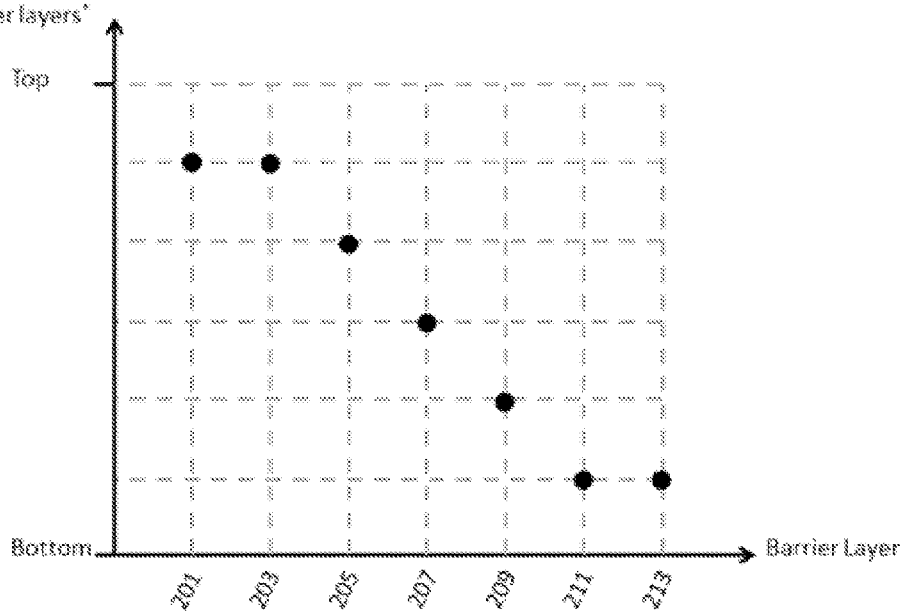
FIG. 9 is a graph that illustrates the position of the minimum of the indium composition within the thickness of the barrier layers of the light emitting region of FIG. 2, according to exemplary embodiments of the current invention.
Figure 10:
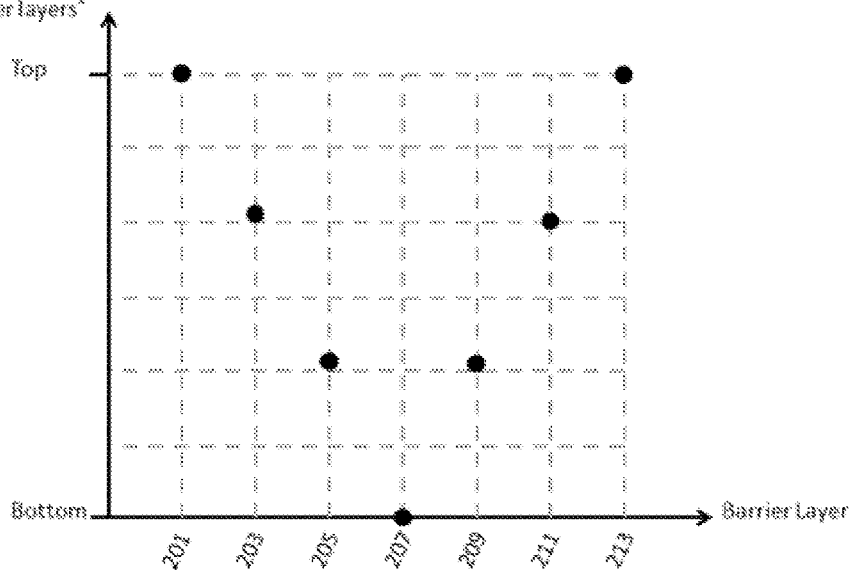
FIG. 10 is a graph that illustrates the position of the minimum of the indium composition within the thickness of the barrier layers of the light emitting region of FIG. 2, according to exemplary embodiments of the invention.

In the exemplary embodiments depicted in FIGS. 9 and 10, the indium composition profile in the barrier layers 201, 203, 205, 207, 209, 211 and 213, possesses one minimum, and the position of this minimum within the thickness of each of the barrier layer changes in a non-monotonous manner across the barrier layers. For example, the position of the minimum may be the same in one or more barrier layers, and the position of the minimum varies in at least three barrier layers. In the example shown in FIG. 9, the position of the indium minimum is the same in the barrier layers 201 and 203, and in the barrier layers 211 and 213. In another example illustrated in FIG. 10, the position of the indium minimum may vary linearly starting sensibly closer to the top of the barrier layer 201 which is closer to the n-type semiconductor layer toward the bottom of the barrier layer 207 and then move again linearly toward the top of the barrier layer 213.

Figure 11:
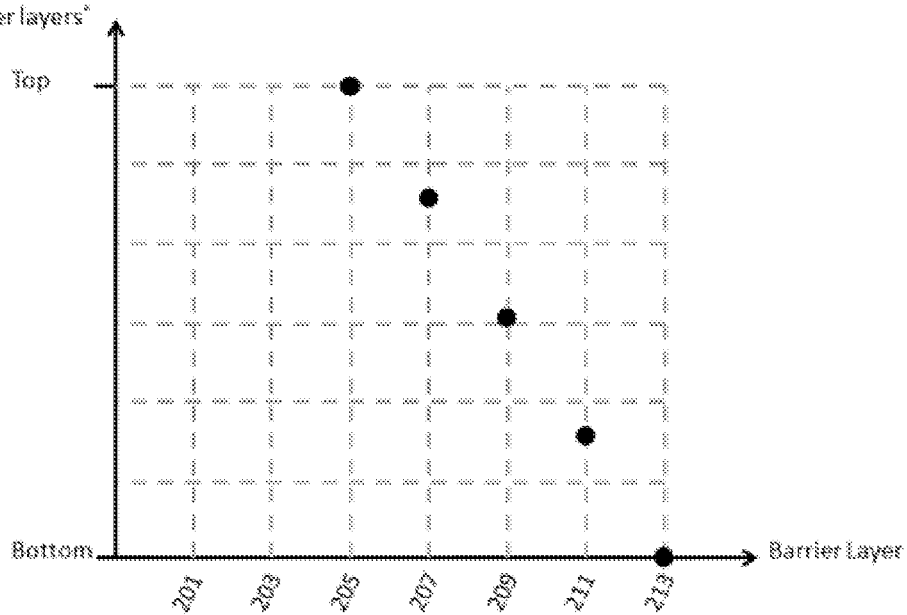
FIG. 11 is a graph that illustrates the position of the minimum of the indium composition within the thickness of the barrier layers of the light emitting region of FIG. 2, according to exemplary embodiments of the current invention.

In the exemplary embodiment depicted in FIG. 11, one or more barrier layers of the active region 103 have a composition which does not vary (then the indium composition profile in these barrier layers does not have a minimum), and at least three barrier layers in the active region have an indium composition which varies across their thickness. In the example shown in FIG. 11, the barrier layers 201 and 203 have a flat indium composition profile across their thickness (for example, these barrier layers can be made of, but not limited to, GaN or InGaN with a fixed indium mole fraction).

Figure 12:
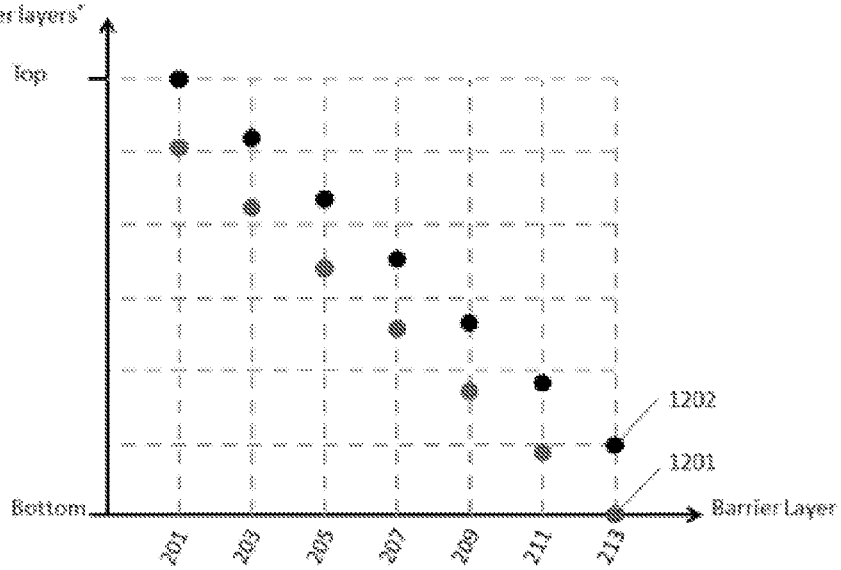
FIG. 12 is a graph that illustrates the position of the minimum of the indium composition within the thickness of the barrier layers of the light emitting region of FIG. 2, according to exemplary some embodiments of the current invention.

In the exemplary embodiment depicted in FIG. 12, the indium composition profile in one or more of the barrier layers 201, 203, 205, 207, 209, 211 and 213, possesses two or more minimums, and the position of these minimums within the thickness of each of the barrier layer may vary as in the previous embodiments. In the example illustrated in FIG. 12, the indium composition profile in each barrier layers exhibits two minimums such as the position of these minimums are moving linearly across the thickness of the barrier layers.

Many different embodiments have been disclosed herein, in connection with the above description and the drawings. It will be understood that it would be unduly repetitious and obfuscating to literally describe and illustrate every combination and sub-combination of these embodiments. Accordingly, all embodiments can be combined in any way and/or combination, and the present specification, including the drawings, shall be construed to constitute a complete written description of all combinations and sub-combinations of the embodiments described herein, and of the manner and process of making and using them, and shall support claims to any such combination or sub-combination.

While embodiments of the present invention have been described with reference to a light emitting region made of InGaN barrier layers and InGaN quantum well layers, the teachings and benefits of the present invention may also be provided in other group III nitrides. For example, a light emitting region made of AlGaN barrier layers and GaN or InGaN quantum well layers, or AlInGaN barrier layers and AlInGaN quantum well layers.

Although the invention has been shown and described with respect to a certain embodiment or embodiments, equivalent alterations and modifications may occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein exemplary embodiment or embodiments of the invention. In addition, while a particular feature of the invention may have been described above with respect to only one or more of several embodiments, such feature may be combined with one or more other features of the other embodiments, as may be desired and advantageous for any given or particular application.

INDUSTRIAL APPLICABILITY

The present invention finds applications in electronic products that utilize light emitting devices, such as light emitting diodes (LEDs), as significant components. Examples of such products include, without limitation, backlighting units for liquid crystal displays, headlamps for automobiles, or general lighting.

What is claimed is:

1. A group III nitride-based light emitting device comprising:
   an n-type group III nitride-based semiconductor layer,
   a p-type group III nitride-based semiconductor layer, and
   a group III nitride-based active region between the p-type semiconductor layer and the n-type semiconductor layer, the active region comprising a plurality of sequentially stacked group III nitride-based quantum well layers interspersed with barrier layers with no two barrier layers being adjacent to each other;
   wherein a plurality of the barrier layers have a variation in composition of a first element along a growth direction within a thickness of each of the plurality of barrier layers, and the variation in composition of the first element has at least one minimum and a position of the minimum varies across a thickness direction in the plurality of barrier layers progressively between a p-type side of the active region and an n-type side of the active region.

2. The nitride-based light emitting device according to claim 1, wherein the barrier layers are AlInGaN layers.

3. The nitride-based light emitting device according to claim 1, wherein the first element is indium.

4. The nitride-based light emitting device according to claim 1, wherein the first element is aluminium.

5. The nitride-based light emitting device according to claim 1, wherein the barrier layers are InGaN layers and the first element is indium.

6. The nitride-based light emitting device according to claim 1, wherein the position of the minimum varies linearly in the plurality of barrier layers, starting closer to a bottom of a barrier layer which is closer to the n-type semiconductor layer.

7. The nitride-based light emitting device according to claim 1, wherein the position of the minimum varies linearly in the plurality of barrier layers, starting closer to a top of a barrier layer which is closer to the n-type semiconductor layer.

8. The nitride-based light emitting device according to claim 1, wherein the position of the minimum varies in a non-linear manner in the plurality of barrier layers.

9. The nitride-based light emitting device according to claim 8, wherein the position of the minimum varies in an exponential manner in the plurality of barrier layers.

10. The nitride-based light emitting device according to claim 8, wherein the position of the minimum varies in a logarithmic manner in the plurality of barrier layers.

11. The nitride-based light emitting device according to claim 8, wherein the position of the minimum varies in a polynomial manner in the plurality of barrier layers.

12. The nitride-based light emitting device according to claim 1, wherein the position of the minimum varies in a monotonous manner in the plurality of barrier layers.

13. The nitride-based light emitting device according to claim 1, wherein the position of the minimum varies in a non-monotonous manner in the plurality of barrier layers.

14. The nitride-based light emitting device according to claim 1, wherein the position of the minimum varies in all the barrier layers of the active region.

15. The nitride-based light emitting device according to claim 1, wherein the plurality of barrier layers have a variation in composition of the first element within the thickness of the plurality of barrier layers, and wherein the variation in composition of the first element has at least two minimums and positions of the two minimums vary in the plurality of barrier layers.

16. The nitride-based light emitting device according to claim 3, wherein the indium composition in the plurality of barrier layers is graded.

17. The nitride-based light emitting device according to claim 4, wherein the aluminum composition in the plurality of barrier layers is graded.

18. The nitride-based light emitting device according to claim 1, wherein the composition of the first element in the plurality of barrier layers varies in a portion of the barrier layers, and does not vary in another portion of the barrier layers.

19. The nitride-based light emitting device according to claim 18, wherein the composition of the first element in the plurality of barrier layers varies in at least three of the barrier layers.

20. A group III nitride-based LED, comprising:
   an n-type group III nitride-based semiconductor layer,
   a p-type group III nitride-based semiconductor layer, and
   a group III nitride-based active region between the p-type semiconductor layer and the n-type semiconductor layer, the active region comprising at least six sequentially stacked group III nitride-based quantum well layers and at least seven barrier layers with no two barrier layers being adjacent to each other;
   wherein at least three of the barrier layers have a variation in composition of a first element along a growth direction within their thickness, and the variation in composition of the first element has at least one minimum and a position of the minimum varies across a thickness direction in the at least three barrier layers progressively between a p-type side of the active region and an n-type side of the active region.

* * * * *